United States Patent [19]

Leach

[11] Patent Number: 4,535,465

[45] Date of Patent: Aug. 13, 1985

[54] LOW POWER CLOCK GENERATOR CIRCUIT

[75] Inventor: Jerald G. Leach, Houston, Tex.

[73] Assignee: Texas Instruments Incorporated, Dallas, Tex.

[21] Appl. No.: 334,486

[22] Filed: Dec. 24, 1981

[51] Int. Cl.³ .......................................... H03K 23/22
[52] U.S. Cl. ..................... 377/46; 307/453; 307/481; 307/482; 377/47; 377/117; 377/126
[58] Field of Search ............... 307/443, 452, 453, 481, 307/482, 578, 582, 583, 269, 606; 377/46, 47, 105, 117, 126

[56] References Cited

U.S. PATENT DOCUMENTS

| | | | |
|---|---|---|---|
| 3,518,451 | 6/1970 | Booher | 307/443 |
| 4,164,666 | 8/1979 | Hirasawa | 307/443 X |
| 4,165,541 | 8/1979 | Varshney et al. | 377/105 X |
| 4,316,106 | 2/1982 | Young et al. | 307/443 X |

Primary Examiner—Stanley D. Miller
Assistant Examiner—D. R. Hudspeth
Attorney, Agent, or Firm—Thomas E. Tyson; Leo N. Heiting; Melvin Sharp

[57] ABSTRACT

A digital clock generator circuit including a series of inverters connected in cascade with the output of the final stage connected to the input of the first stage in a ring counter fashion. Each inverter includes a first circuit to precharge a node, a second circuit to discharge a node upon occurrence of a selected input signal and a third circuit connected to isolate the node from the circuitry output during the precharge interval. The output of the counter is the output of the final stage. The inverter circuits allow for a low power digital counter by allowing a P-MOS or N-MOS fabrication of devices that do not require continuous power.

2 Claims, 20 Drawing Figures

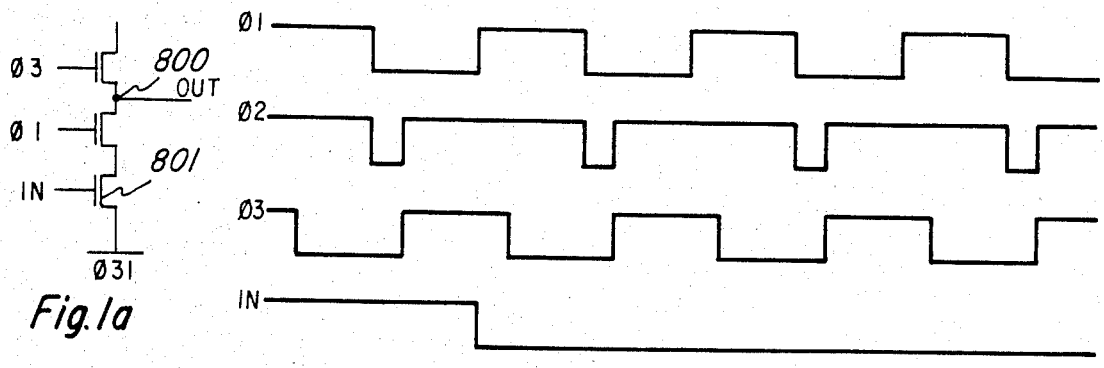
Fig. 1a
Fig. 1b
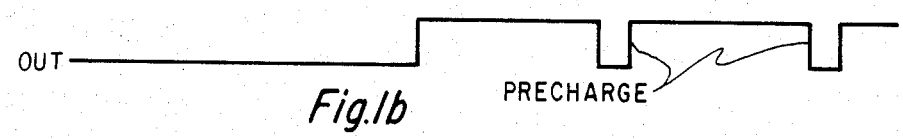
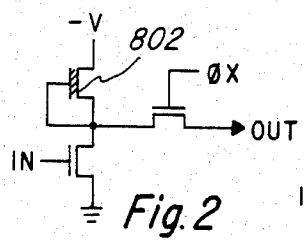
Fig. 2
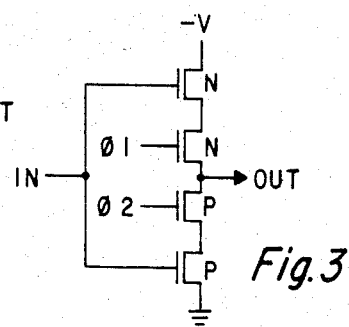
Fig. 3
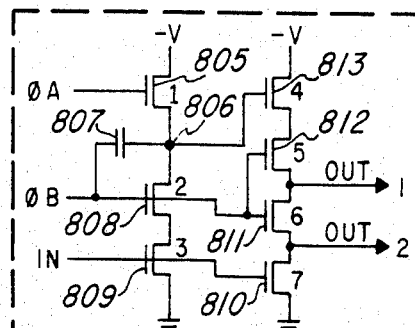
Fig. 4a
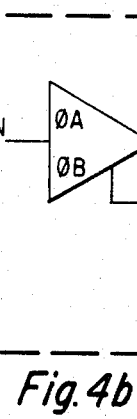
Fig. 4b
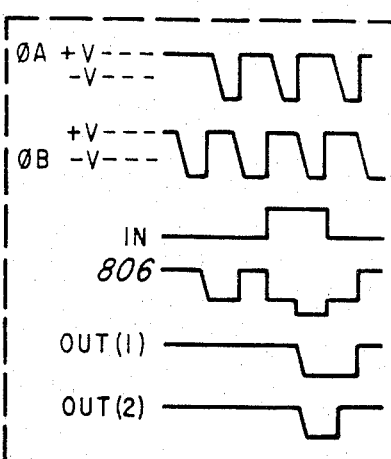
Fig. 4c

LOW POWER CLOCK GENERATOR CIRCUIT

RELATED APPLICATIONS

U.S. Patent applications that are related to the present application include U.S. Pat. Ser. No. 335,028 entitled, "Low Power Circuit for Microcomputer", U.S. patent application Ser. No. 335,029 entitled, "Low Power Display Circuit", U.S. patent application Ser. No. 334,852 entitled, "Low Voltage RAM Cell", U.S. patent application Ser. No. 334,487 entitled "Low Power Oscillator Circuit", and U.S. patent application Ser. No. 334,850 entitled "Integrated On/Off Switch".

BACKGROUND

1. Field of the Invention

This invention relates to digital processing circuitry and more particularly to low power circuits for digital processing.

2. Prior Art

Electronic calculator systems of the type having all the main electronic functions within a single, large scaled integrated (LSI) semiconductor chip or small numbers of chips are described in the following prior applications or patents assigned to Texas Instruments Incorporated:

U.S. Pat. No. 3,819,921 by Kilby et al for "Miniature Electronic Calculator", based on an application originally filed Sept. 29, 1967;

U.S. Pat. No. 4,074,351 by Boone and Cochran for "Variable Function Program Calculator";

U.S. Pat. No. 8,892,957 by Bryant for "Digital Mask Logic in Electronic Calculator Chip;" and U.S. Pat. No. 3,987,416 by Vandierendonct, Fischer and Hartsell for "Electronic Calculator With Display and Keyboard Scanning".

These prior inventions made possible vast reductions in cost and size and increases in functions of electronic calculators. Many millions of such calculators have been produced. The efforts to reduce manufacturing costs and increase the functions available to the user are continuing. Particularly it is desired to provide a basic chip structure that is quite versatile and can be used for many different types of calculators and similar digital processing equipment. This permits a single manufacturing facility to produce a large quantity of the same devices, differing only in a single mask change, to produce a dozen variations while still maintaining large volume cost advantages.

The previous MOS/LSI calculator chips as referred above were generally register organized in that a single instruction word operated on all of the digits in a given register. A more versatile approach is to make the machine digit organized, operating on one digit at a time. For example, it may be desired to test or set a particular one bit flag. In a register machine, an entire 13 digit register must be addressed and mask to implement this, whereas a digit organized machine may access only the needed digit or bit. An example of such a processing chip is disclosed in U.S. Pat. No. 3,991,305 by Caudel et al entitled, "Electronic Calculator or Digital Processor Chip with Multiple Code Combinations of Display and Keyboard Scan Outputs". This patent discloses what is commonly known in industry as the TMS 1000 architecture for a 4 bitmicrocomputer. Another approach using this same type of architecture is disclosed in U.S. patent application Ser. No. 216,113 entitled, "Dual Register Digital Processor System" by Koeppen, Rogers, Solimeno and Brown. The architecture of disclosed herein is similar to these TMS 2000 architecture and the architecture disclosed in the above applications implemented with low power circuits.

FIG. 1A illustrates the prior art attempt at low power operation using positive channel MOS field effect transistor devices. This type of circuit is referred to as precharge and conditional discharge circuitry. The node 800 becomes charged during Phi 3. It should be noted that since the circuitry is presented in P-MOS, the devices are active during the negative portions of the timing signals. This node remains charged until conditionally discharged by the input line during Phi 1. If the input line remains high, then the node will remain charged and the output will remain a $-V$ as shown in FIG. 1B. However, if the input is low thus activating device 801, the node 800 will be discharged during phi 1 as shown. The disadvantage ot this standard precharge discharge logic is that the precharge period can cause problems in other circuits, such as in addressing RAM cells. If the precharge discharge logic is connected directly in the addressing portion of the RAM cell, all the addresses are ON during the precharge time. Therefore, if precharge discharge logic is used to address a RAM, additional circuits are required to buffer the precharge intervals from the addressing lines of the RAM cells.

FIG. 2 illustrates a static inverter which includes a device with the depleted region 802 to provide charge at the node connected to the output line. The static inverter removes the precharge problem, however, the static inverter also consumes a larger amount of d.c. current. A static inverter also requires that the size of the load device to be much larger than any of the devices in the precharge discharge circuitry. This is a disadvantage when fabricating the circuits on a small silicon chip.

A third approach to the low power circuit operation is shown in FIG. 3, which is a complementary MOS inverter. The clocked CMOS inverter does not have precharges and does not require constant d. c. current. However, the CMOS fabrication process is more expensive and more complex than a normal PMOS or NMOS fabrication process.

The low power approach to many semiconductor display applications has included the use of CMOS, precharge/discharge and static devices. Once such application is circuitry required for liquid crystal displays. Liquid crystal displays require low amounts of power and thus interface well with low power processing circuitry. A reference for liquid crystal display requirements is the *International Handbook of Liquid Crystal Displays* 1975-76, Second Edition, with 1976 / Supplement by Martin Tobias, published Ovum Ltd. 14 Pen Road, London, NC 9RD, England. Another reference is "General Information on Liquid Crystal Display", published by Epson America, Incorporated, 2990 West Lomita Boulevard, Tolerance, Calif. A third reference is an article entitled, "Liquid Crystal Displays" by L. A. Goodman, printed in the *Journal of Vacuum Science and Technology,* Vol. 10, No. 5, Sept/Oct. 1973.

In the past, the LCD devices have required the use of low power circuitry such as the precharge discharge logic, or CMOS logic. This specification discloses another alternative, low power circuit that makes possible a low power interface to LCD's without the disadvantages of the two prior art circuits.

This specification also discloses a low voltage RAM cell. RAM cells are included in the prior named patents. /However, this specification describes a technique to fabricate a low voltage RAM cell.

Other patents including similar techniques are U.S. Pat. No. 4,061,506 entitled "Correcting Doping Defects" by McElroy and U.S. Pat. No. 4,280,271 entitled "Three Level Interconnect Process for Manufacture of Integrated Circuit Devices" by Lou, Ponder and Tubbs.

In past calculators and microcomputer chips, low power CMOS circuitry or static logic have been used to fabricate oscillators in clock circuitry. This specification discloses a technique to fabricate low power oscillator circuitry and clock circuitry without the disadvantage of precharge discharge circuitry, static converters and CMOS circuitry.

Also included in this specification is a description of an integrated circuit ON/OFF switch. The prior art for ON/OFF switches includes the mechanical ON/OFF switch which requires a separate switch dedicated to power switching. The advantage of an integrated ON/OFF switch is that the integrated ON/OFF switch is included in the keyboard and can also be used for other functions. Except for CMOS ON/OFF switches, prior ON/OFF switches have required a constant current flow of a significant degree thus reducing battery life of battery operated microcromputer systems. The disclosed integrated ON/OFF switch requires an insignificant amount of power while in the OFF state without CMOS fabrication.

SUMMARY OF THE INVENTION

In accordance with the present invention, a digital counter circuit is provided that includes a series of inverters connected in cascade. The output of the final inverter stage is connected to the input of the first inverter stage in a ring counter fashion. Each inverter includes the first circuit to precharge a node, a second circuit to discharge the node upon the occurrence of a selected input signal and a third circuit to isolate the node from the circuit output during the precharge. The inverter circuit also includes the capability to add charge to the node upon the ocurrence of a clocking cycle. The charge at the node thus becomes the sum of the charge provided by the precharging circuitry from the inverter power supply and the switching power provided by the clocking signal.

In a preferred embodiment, a digital counter is provided that includes a series of cascaded inverters. The output of each inverter stage connects to the next succeeding inverter stage with the output of the final inverter stage being connected to the input of the first inverter stage. Each inverter includes a first switch to precharge a node in the inverter circuitry. Also included is a second switch which is connected to the node to discharge the node upon occurrence of a selected input signal. A third switch is also provided to isolate the node during the precharge interval. Further, the capability is provided to precharge the node with a clocking signal in addition to the precharge received by the first switch. This enables the node to be precharged to a level greater than the level of precharge received from the inverter power supply alone. By using this technique of increasing the node charge the charge lost due to successive stages of inverters is negligible. Therefore the inverters may be used with a smaller power supply than would be normally possible.

BRIEF DESCRIPTION OF THE DRAWINGS

FIG. 1A is a schematic diagram of precharge/discharge logic.

FIG. 1B is a timing diagram for precharge/discharge logic.

FIG. 2 is a schematic diagram of static inverter.

FIG. 3 is a schematic diagram of a complementary MOS inverter.

FIG. 4A is a schematic diagram of a low power MOS inverter.

FIG. 4B is a symbolic diagram of the low power MOS circuit shown in FIG. 4A.

FIG. 4C is a timing diagram of the low power MOS circuit in FIG. 4A.

DETAILED DESCRIPTION OF THE INVENTION

Figure 5:
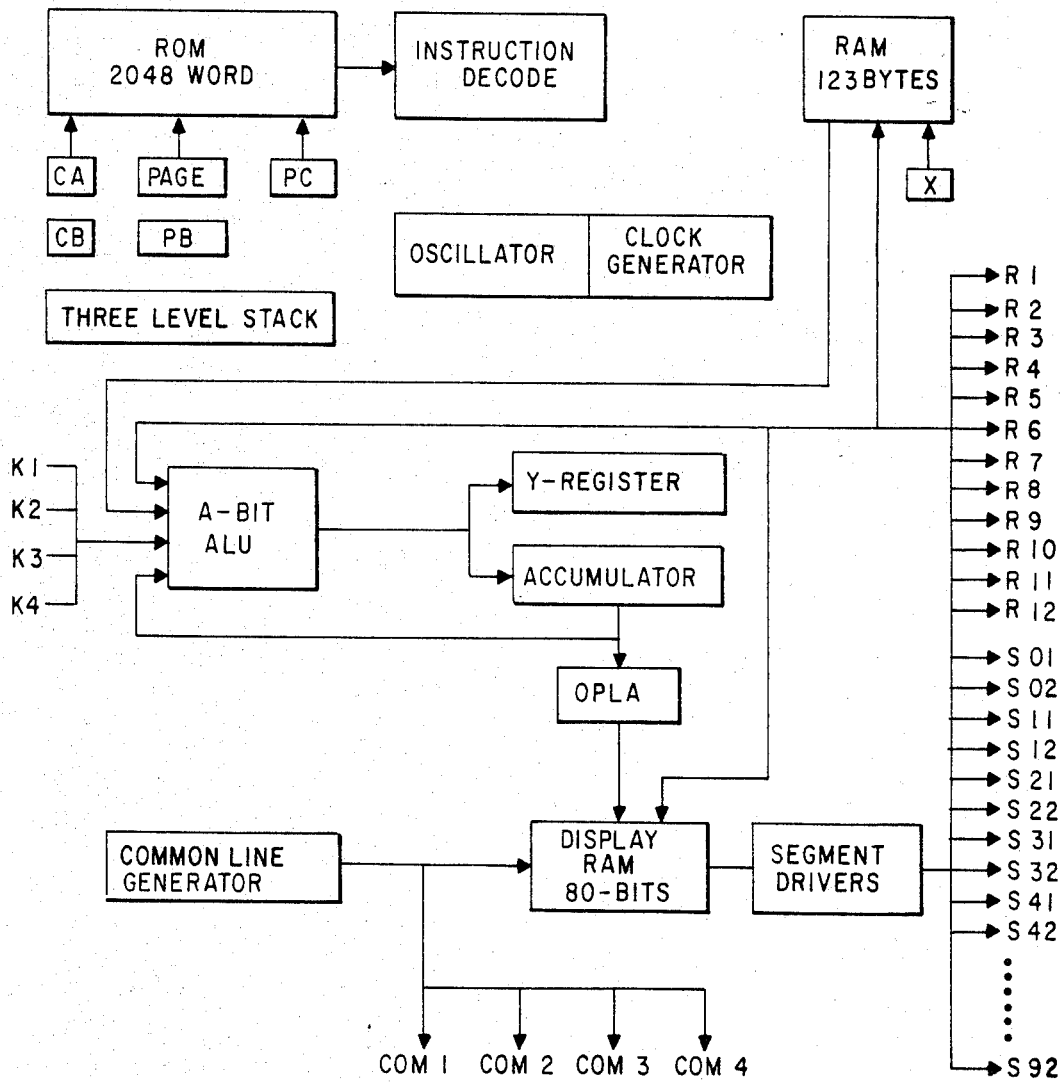
FIG. 5 is a block diagram of a microcomputer using low power MOS circuitry.

FIG. 4A is the schematic drawing of the basic low power inverter. The symbol for this circuitry in FIG. 4A is shown in FIG. 4B. Timing diagrams for this circuitry is shown in FIG. 4C. Referring to FIG. 4A, the node 806 is charged during the time frame phi A by device 805. During phi B, the node 806 is discharged by the input line and device 809, if the input is low for PMOS circuitry. If, however, the input is high, then the timing signal phi B provides an additional charge through capacitor 807 to node 806. Node 806 turns on device 813 if charged and phi B likewise turns on devices 811 and 812. If the input is high thus not turning on device 810, the lines marked "out 1" and "out 2" produce an output voltage of $-V$ The node 806 produces a voltage that is below $-V$ since node 806 receives charge from $-V$ or the negative rail, plus charge from the clocking phase phi B through capacitor 807. Therefore the voltage at node 806 is greater than $-V$ as shown in FIG. 4A. This type of circuitry results in a low power inverter without the use of precharge/discharge logic or static inverters. In addition, all the devices shown in FIG. 4A may be fabricated in a PMOS structure as small devices.

FIG. 5 illustrates the block diagram of the microcomputer circuitry disclosed. It should be noted that this microcomputer circuitry is similar to that disclosed in U.S. Pat. No. 3,991,305 which is herein incorporated by reference. In addition, this basic type of architecture is also disclosed in U.S. Pat. application Ser. No. 216,113 which is also herein incorporated by reference. Instructions for this microprocessor system are contained in the read only memory (ROM) which are addressed by a chapter register (CA,), page register (PAGE), and program counter (PC). The chapter register and page register both contain a chapter buffer (CB) and page buffer (PB). In addition, there is provided a three level stack for subroutine calls. The output of the ROM is decoded by instruction decoder to provide the control signals for the remainder of the microcomputer circuitry. The timing for the microcomputer circuitry is provided by the oscillator. The input to the device is through the K1 through K4 ports. These inputs are applied to the four bit arithmetic logic unit (ALU). The ALU also receives inputs from a random access memory RAM (a device provided for temporary storage of data). The arithmetic logic unit outputs to a Y register and an accumulator which also may provide inputs back into the arithmetic logic unit. The Y register also outputs to the RAM and to register digit outputs from the microcomputer (RO through R12). The accumulator provides output to the output programmed logic array (OPLA) which in turn provides data to the display RAM. The display RAM also receives an output from the Y register. The common line generator, display RAM and segment drivers provide outputs to drive LCD devices.

This block diagram (without the LCD interface is discussed in more detail in the *TMS 1000 Series Data Manual,* dated December 1975, published by Texas Instruments Incorporated, which is herein incorporated by reference. This circuitry is also discussed in the *TMS 1000 Series MOS/LSI One Chip Microcomputers Programmers Reference Manual,* published by Texas Instruments Incorporated and herin incorporated by reference.

Figure 6:
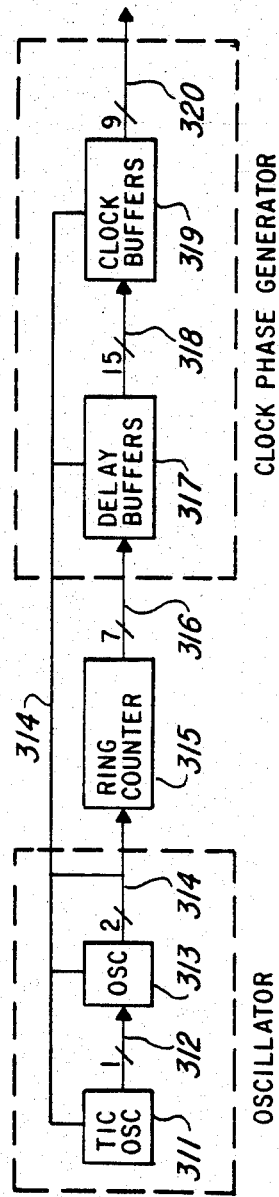
FIG. 6 is a block diagram of the oscillator and clock phase generator.
Figure 7:
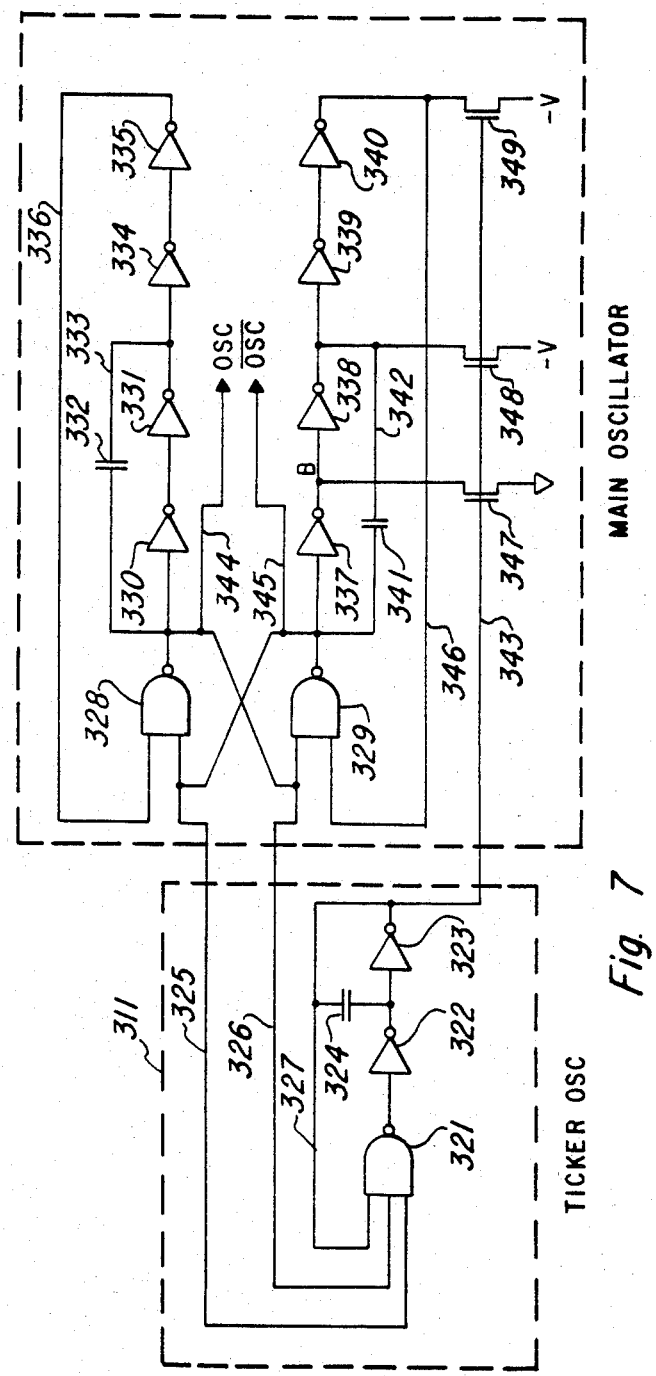
FIG. 7 is a logic diagram of the oscillator.
Figure 8A:
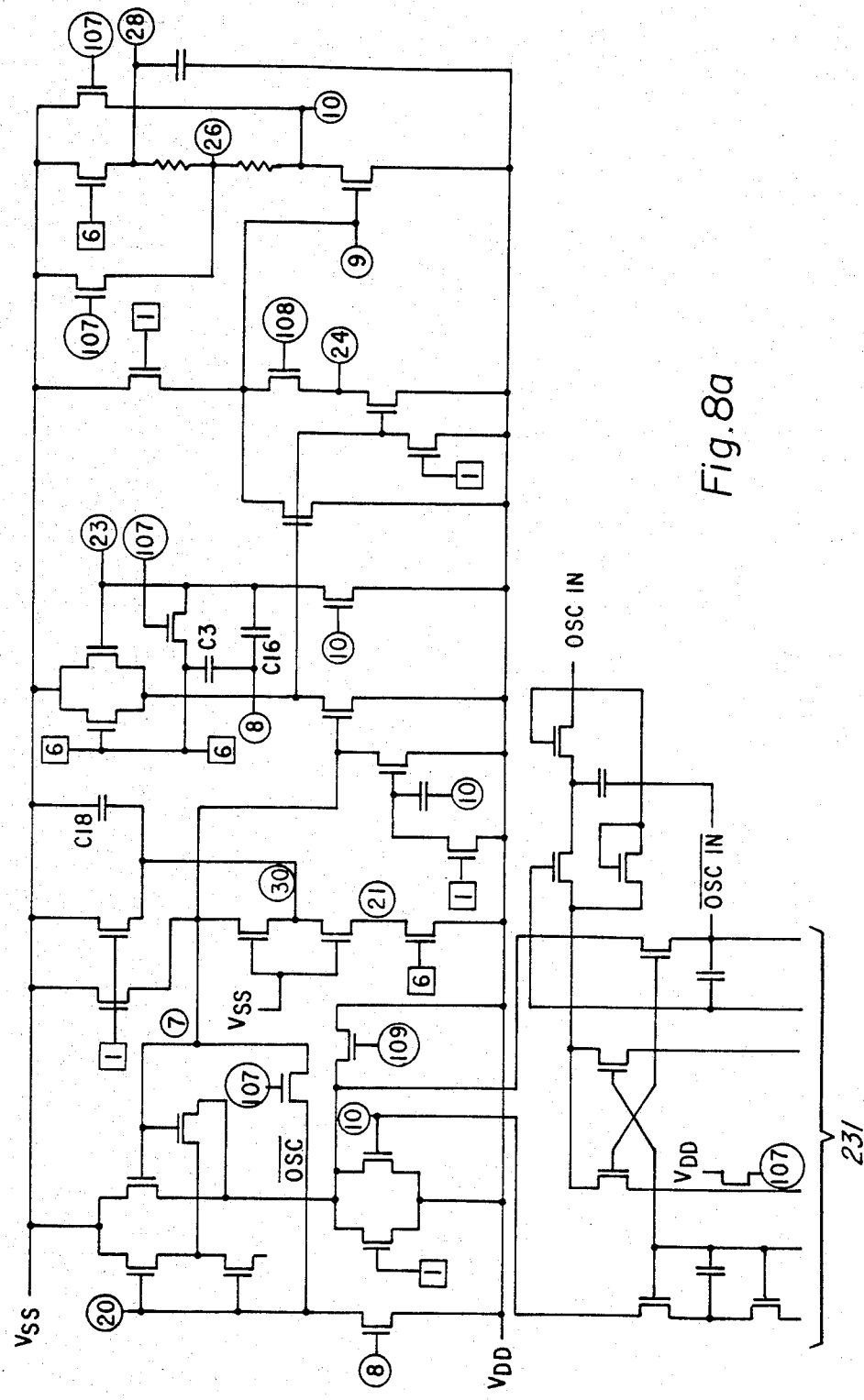
FIGS. 8a and 8b together are a schematic diagram of the oscillator.
Figure 8B:
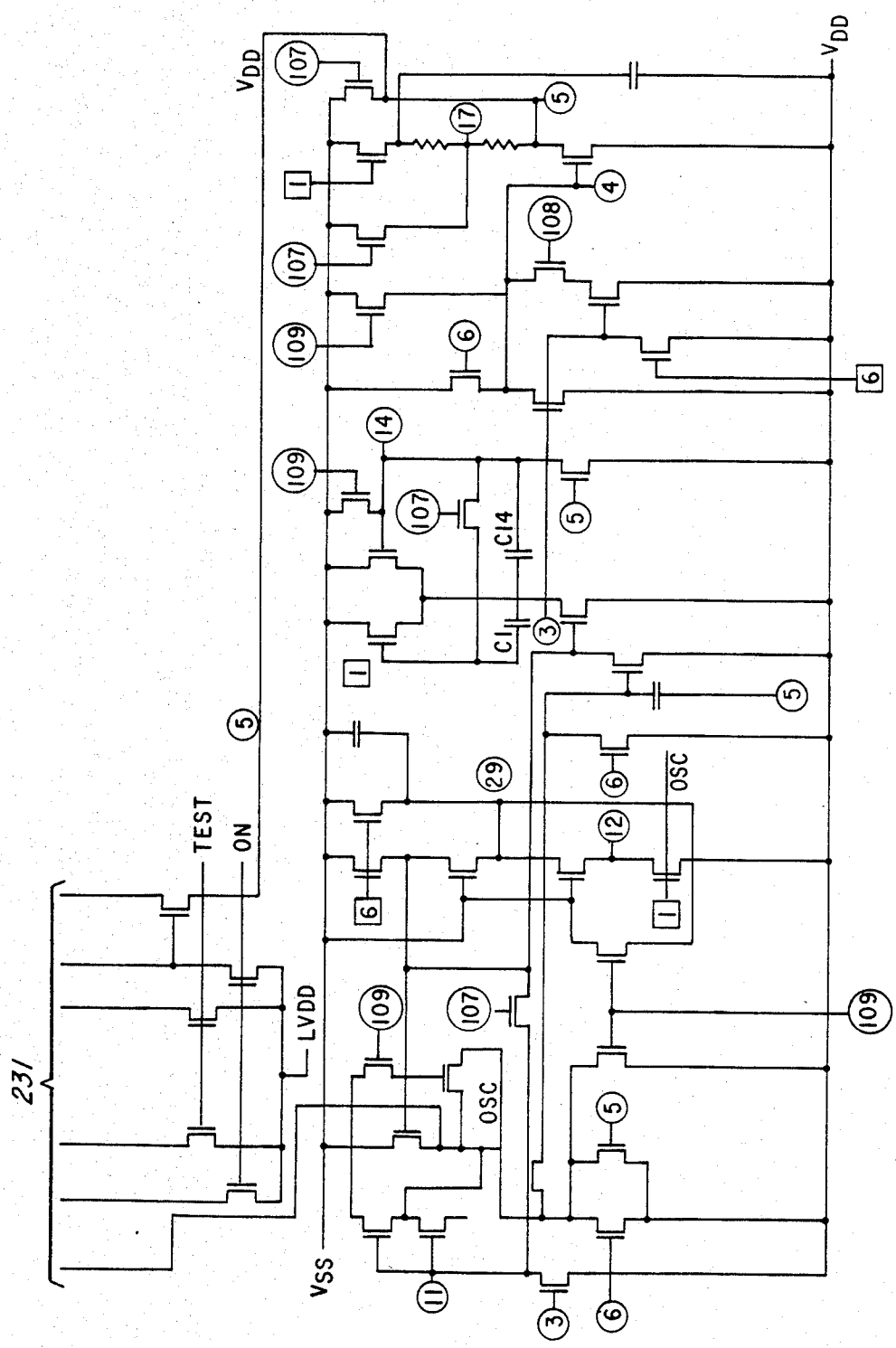

FIG. 6 is a block diagram of the clock generator circuitry. Block 311 represents a tickler oscillator which starts the oscillator 313 via line 312. Oscillator 313 then outputs two oscillator signals to the ring counter 315 which then outputs timing signals on line 316 to the delay buffers 317. The delay buffers provide 15 signals on lines 318 to the clock buffers as shown. Nine clock signals are output on lines 320. The logic diagram of the oscillator circuit and tickler circuit is shown in FIG. 7. Block 311 contains logic for the tickler oscillator which contains a static NAND gate 321 connected to two static converters 322 and 323. Note that capacitor 324 is connected from the output of inverter 322 to the input of the static NAND gate 321. This capacitor adds charge to the output of device 323 to drive device in the main oscillator 347, 348 and 349. This technique is called "bootstrapping" or driving the value to a voltage that is greater than the negative power supply. The purpose of the tickler oscillator is to start the oscillator 313 upon power up. Oscillator 313 is illustrated as two loops of inverters connected with NAND gates that are cross coupled. Note that capacitors 332 and 341 are provided in these inverter loops to provide extra charge for the oscillator outputs at 344 and 345. Inverters 330, 334, and 338 are gated by OSC-. Inverters 331, 337 and 339 are gated by OSC. Inverters 335 and 340 are similar to the static inverters as illustrated in FIG. 2. NAND gates 328 and 329 gated by Signal A and Signal B, respectively.

Figure 9A:
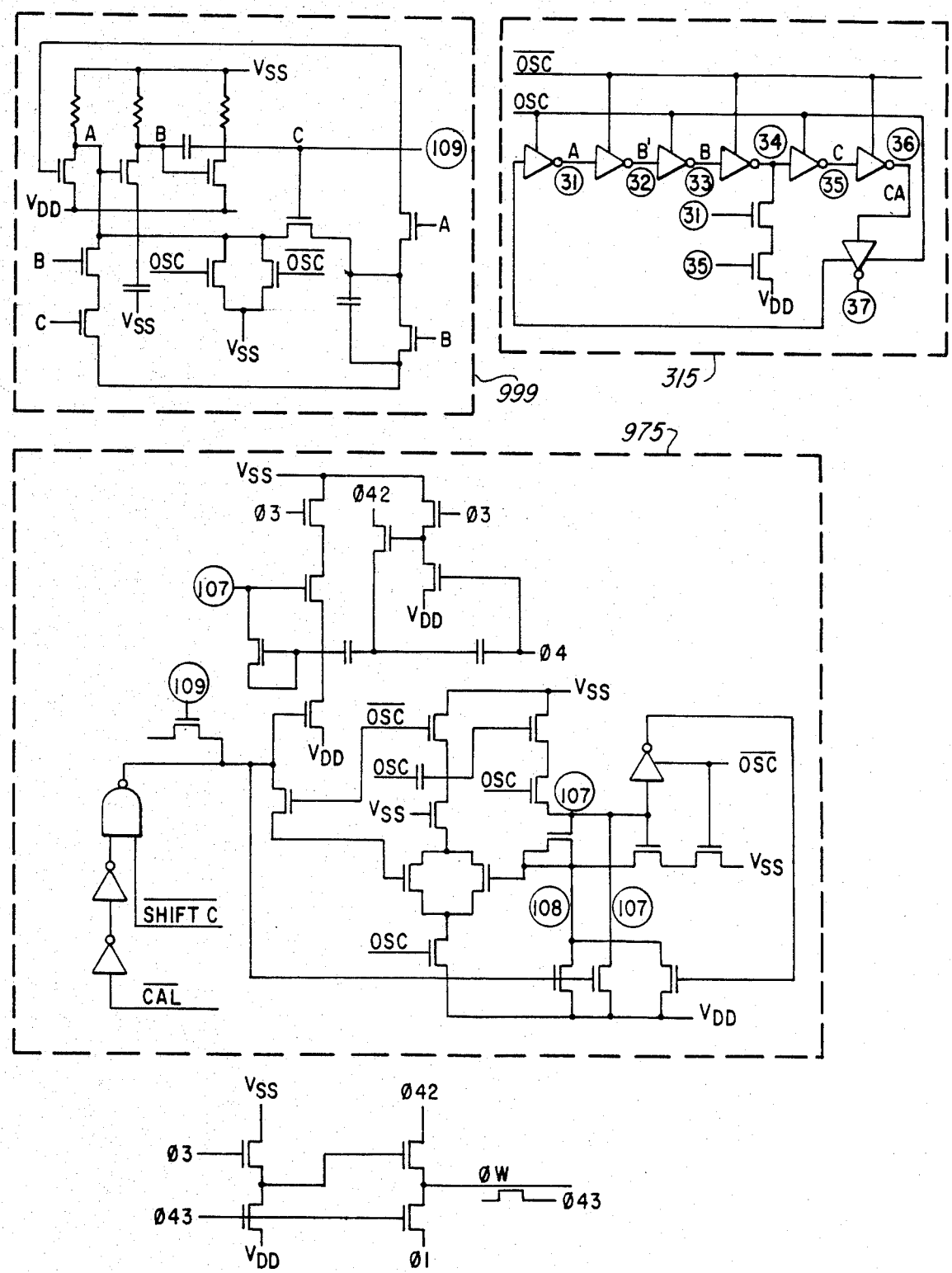
FIG. 9a is a schematic diagram of the ring counter, tickler oscillator and high/low frequency circuitry.
Figure 10:
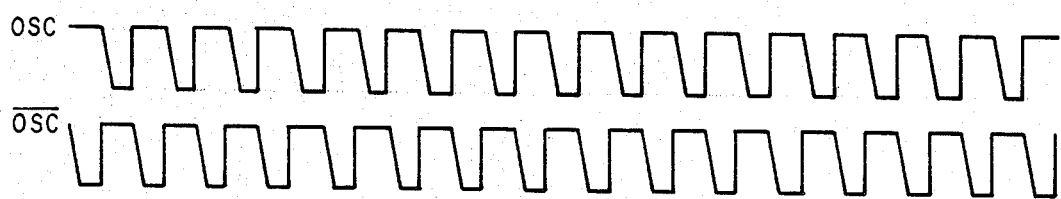
FIG. 10 is a timing diagram for the oscillator output.
Figure 11:
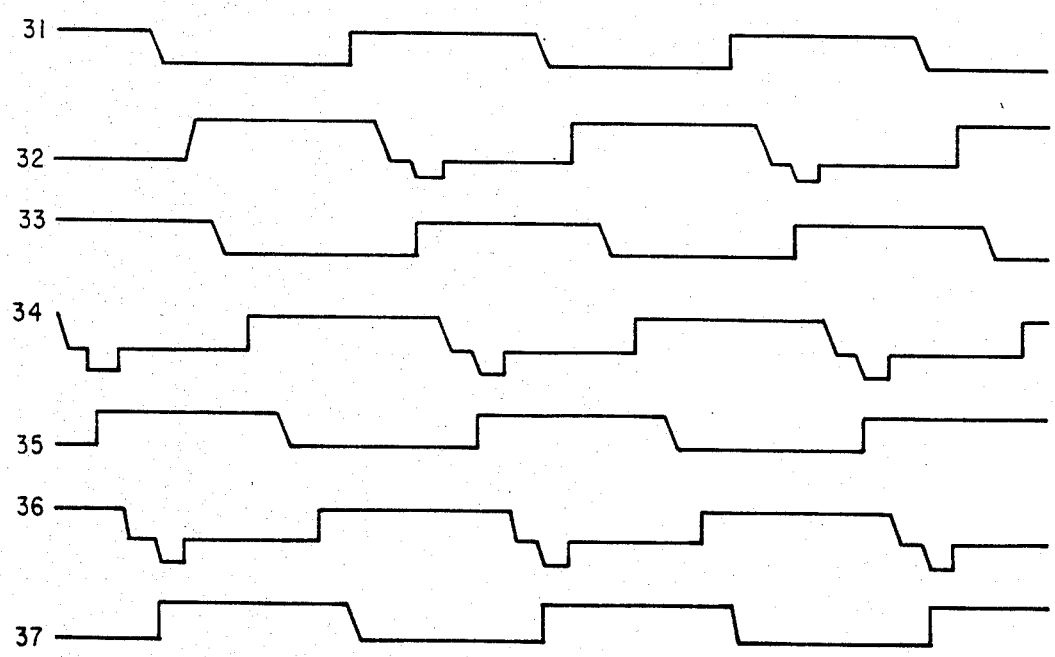
FIG. 11 is a timing diagram for the ring counter output.

FIG. 9a contains a schematic diagram of the ring counter 315 as shown. The circles numbers 31, 32, 33, 34, 35 and 36 represent signals at those particular node points. These numbers are used elsewhere in the delayed buffer circuitry 317 (in FIG. 6) to produce signals for the clock buffers. The timing diagram for the oscillator 313 input into the ring counter 315 is shown in FIG. 10. The timing diagram for the output of the ring counter 315 is shown in FIG. 11. Note that the numbers for the waveforms corresponds to the specific nodes as shown in 315 in FIG. 9. Whenever a display is being updated, circuit 975 selects the fast frequency operation in order to more quickly provide the bootstrapped voltage to the display output. Circuit 975 also selects fast frequency operation when CAL- (provided by the user) is active. Also illustrated in the schematic 999 of the tickler oscillator 311 (FIG. 6).

Figure 9B:
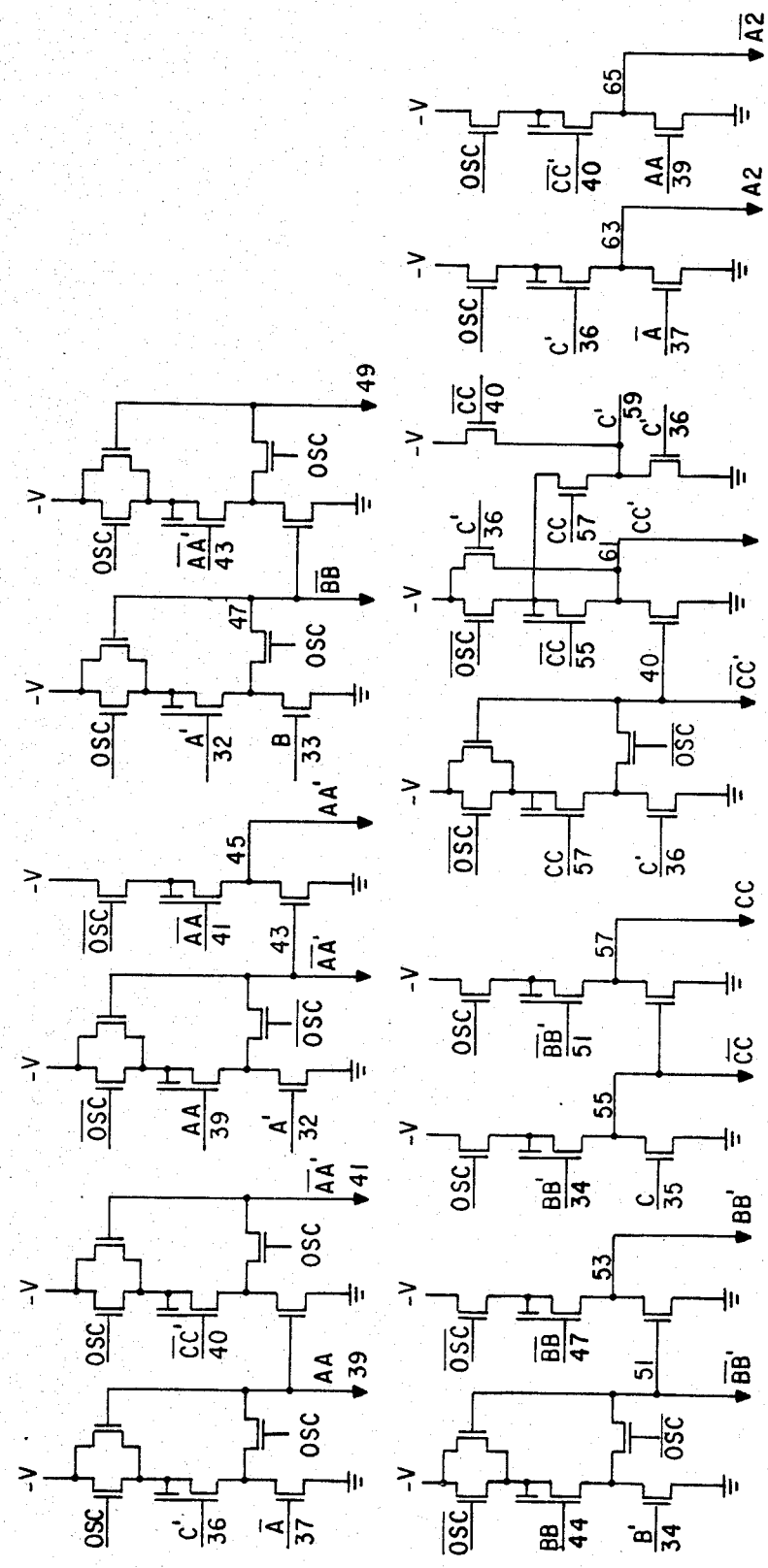
FIG. 9b is a schematic diagram of the delay buffers.
Figure 12:
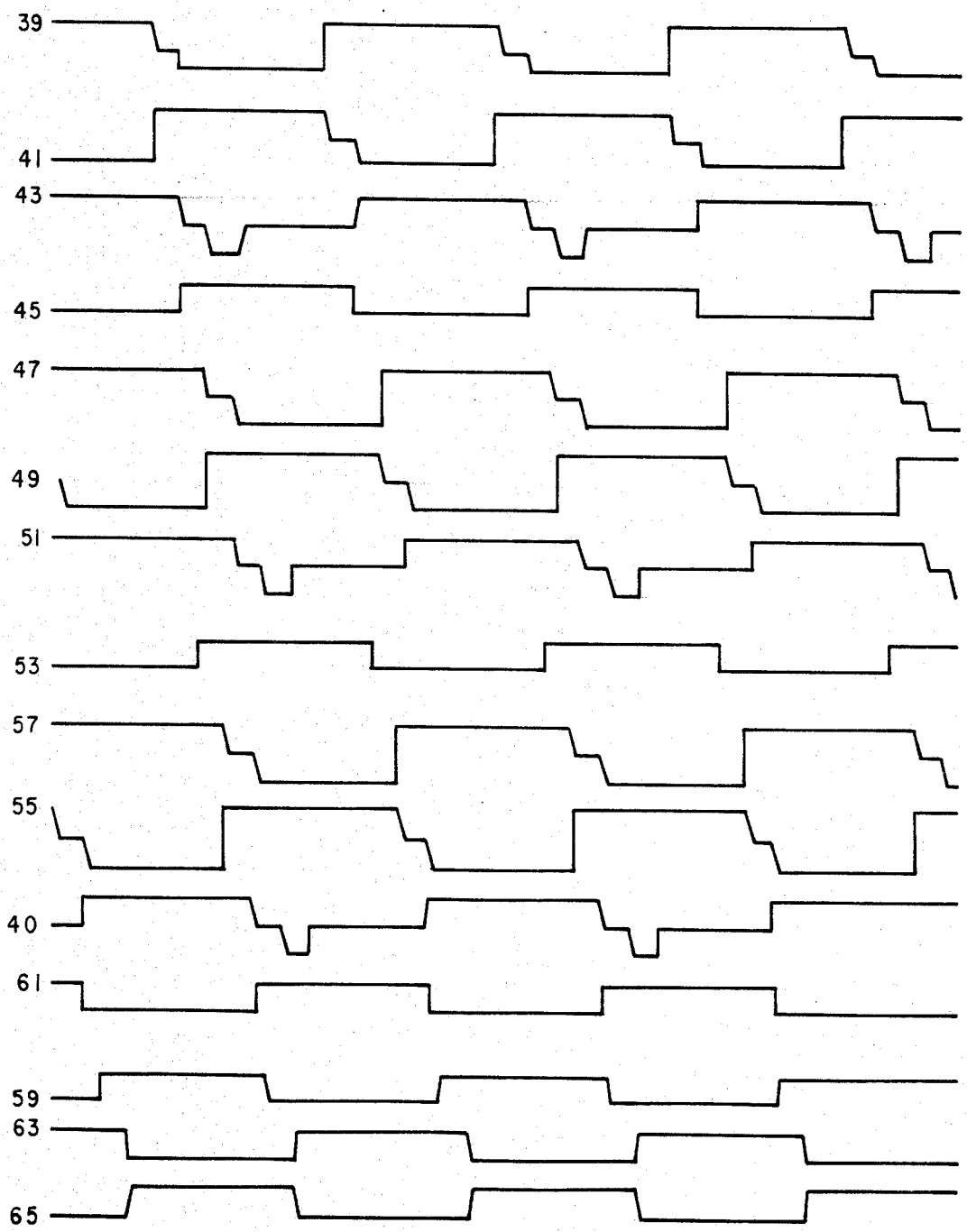
FIG. 12 is a timing diagram of the delay buffer output.
Figure 13:
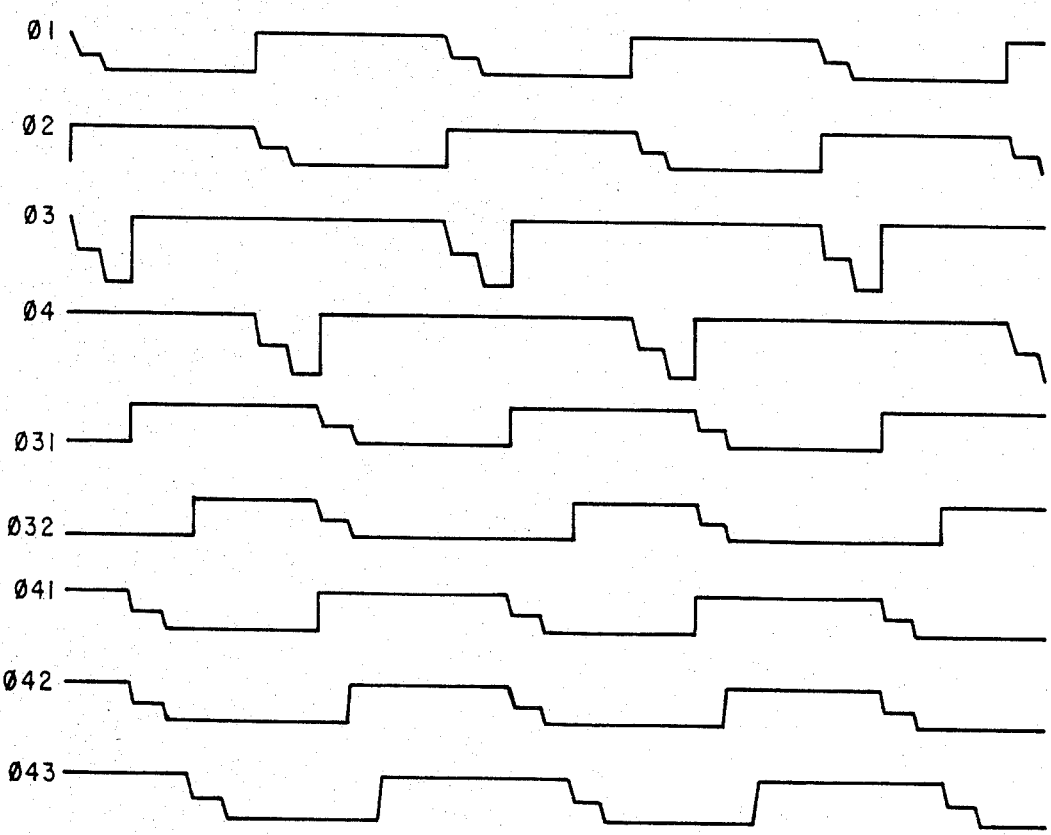
FIG. 13 is a timing diagram for the clock buffer/output.

The delay buffers 317 are shown in schematic form in FIG. 9b. Note that the signal input numbers and output numbers match the respective timing diagram illustrated in FIG. 12. The purpose of the delay buffers 317 is to provide signals which are logically the same as the output of the ring counter 315 but their outputs are "bootstrapped" below the negative supply voltage by use of gated capacitors as shown. These signals are used to drive the clock buffers in FIG. 9c.

Figure 9C:
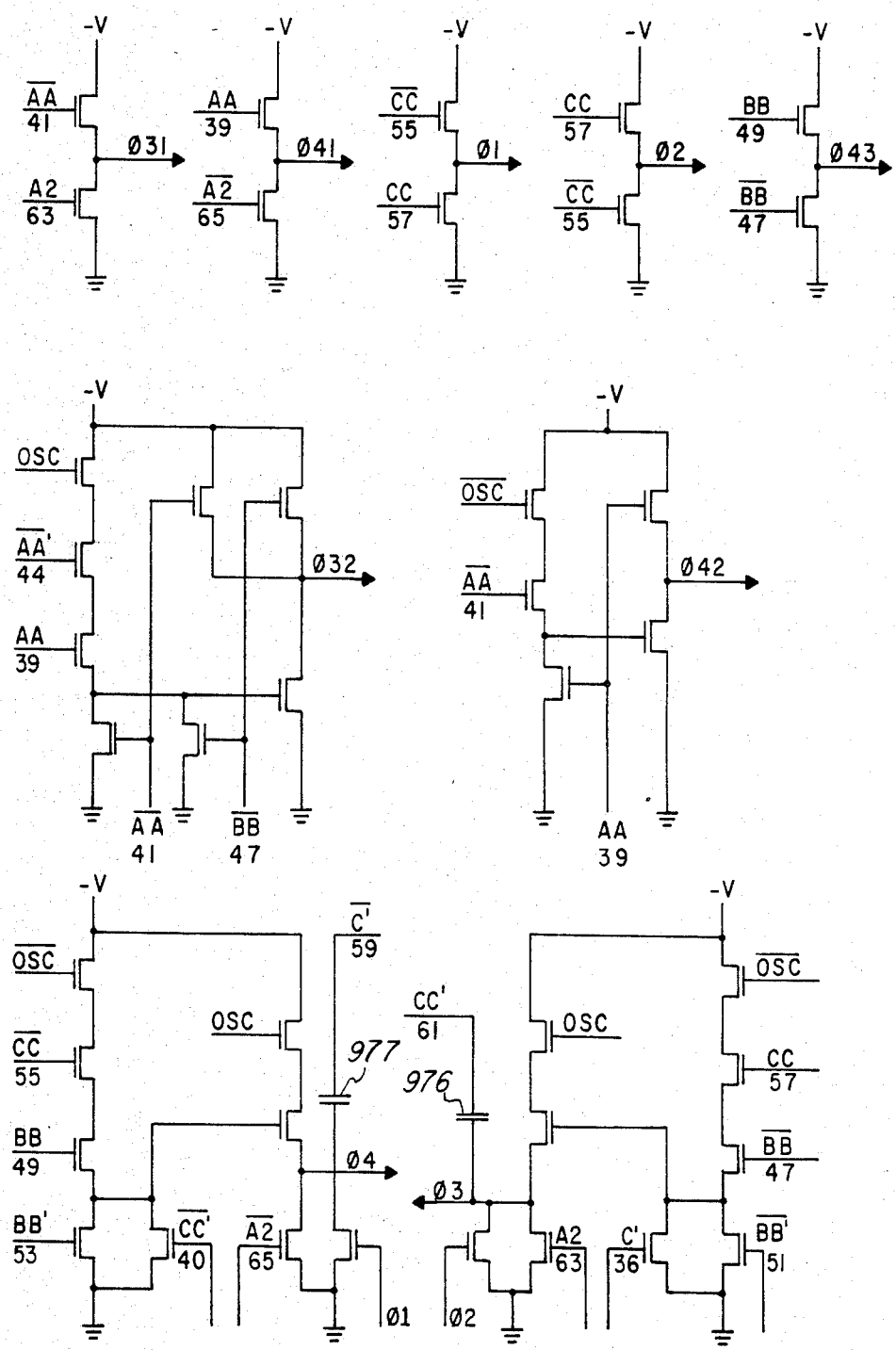
FIG. 9c is a schematic diagram of the clock buffers.

The schematics for the clock buffers 319 are shown in FIG. 9c. These buffers are push-pull circuits. Phi 3 and phi 4 are "bootstrapped" below the negative power supply voltage by the capacitors 976 and 977, respectively.

Figure 14:
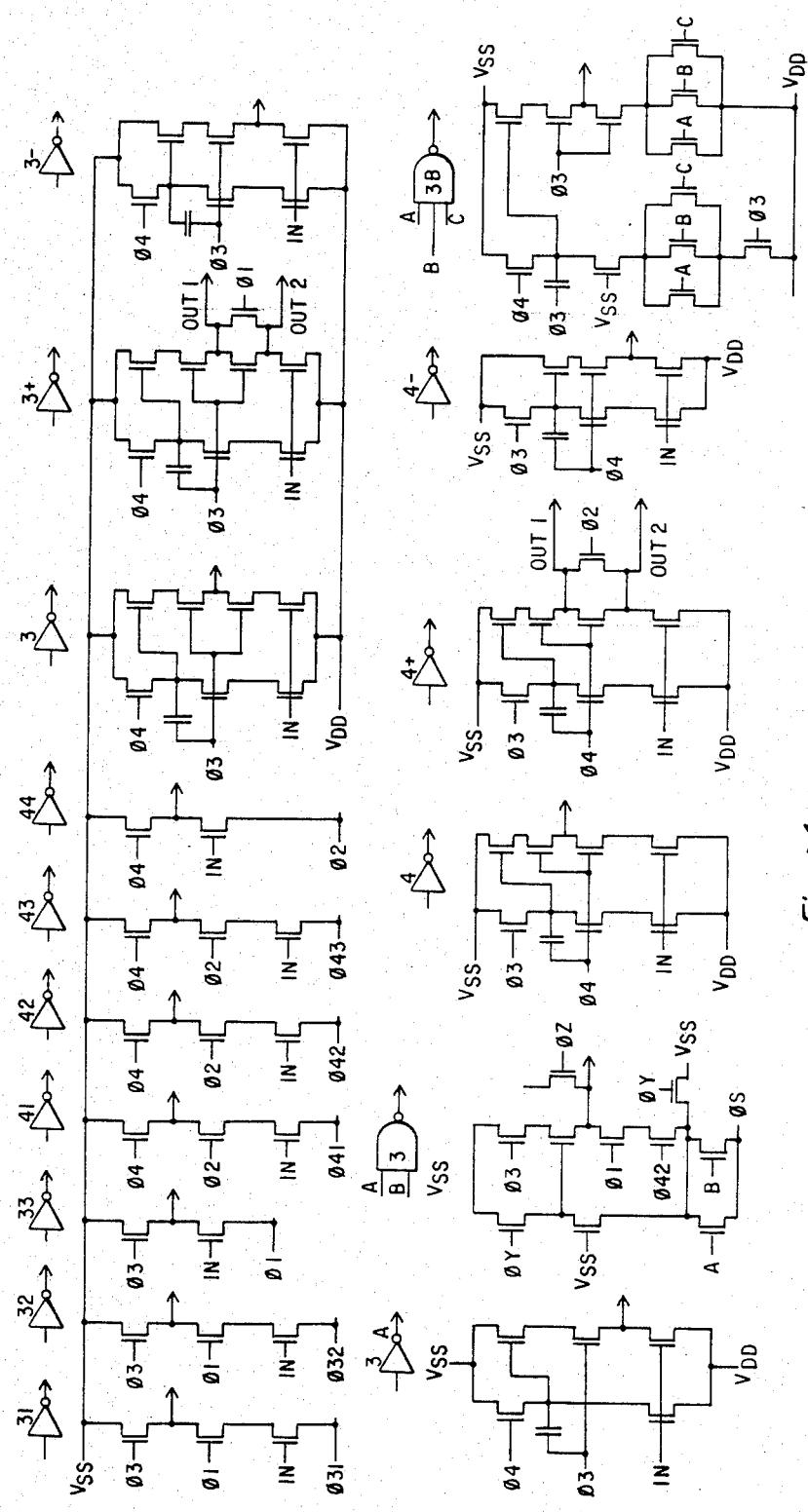
FIG. 14 is a schematic diagram of logic types used in the preceding figures.

FIG. 14 contains schematic diagrams of different logic types used in the preceding schematic figures. Many of these figures are similar to the low power inverter illustrated in FIG. 4.

What is claimed is:

1. A digital counter for counting the number of times an input signal alternates between a first logic state and a second logic state comprising:
    a plurality of inverter means for inverting of signals, having at least a first inverter means and a last inverter means, each inverter means includes an input means for receiving of the input signal; a node; first output and a second output for the last inverter means; a first circuit means for periodically precharging the node; a second circuit means for discharging the node when the input signal is at the first logic state and the first circuit means is not precharging the node; a third circuit means for isolating the node from the first and second output line when the first circuit means is precharging the node; the plurality of inverter means further being connected in cascade arrangement from the first inverter means to the last inverter means and with the first output being connected to the input of the next member of the cascade arrangement and the second output of the last inverter means being connected to the input of the first inverter means, the input of the first inverter means additionally being the input terminal for receiving of the input signal and the first output of the last inverter means being the output terminal for providing a counted output signal; reference potential; and switch means for selectively connecting a first output of a predetermined inverter means to the reference potential in response to the input signal connected thereto.

2. A clock circuit comprising:
    oscillator circuit means for providing a clock signal having a first logic state and a second logic state;
    means for connecting a voltage having a predetermined magnitude to the oscillator circuit;

a digital counter means for counting the clock signal of the oscillator circuit means; delay buffer means for delaying the counted clock signal to obtain separate phases thereof, and includes buffer means, configured with transistor elements for providing an output of a voltage magnitude greater than the usual magnitude wherein the usual magnitude is equal to the predetermined magnitude minus a voltage drop across a member of the transistor element of the counted clock signal; and clock buffer means for buffering the output of the delay buffer means; the clock buffer means and the delay buffer means being of dynamic logic; means for controlling the dynamic logic; the digital counter means includes: a plurality of inverter means for inverting of signals, having at least a first inverter means and a last inverter means, each inverter means includes an input means for receiving of the clock signal; a node: a first output and a second output for the last inverter means; a first circuit means for periodically precharging the node; a second circuit means for discharging the node when the clock signal is at the first logic state and the first circuit means is not precharging the node; a third circuit means for isolating the node from the first and second output line when the first circuit means is precharging the node; the plurality of inverter means further being connected in cascade arrangement from the first inverter means to the last inverter means and with the first output being connected to the input of the next member of the cascade arrangement and the second output of the last inverter means being connected to the input of the first inverter means, the input of the first inverter means additionally being the input terminal for receiving of the clock signal and the first output of the last inverter means being the output terminal for providing a counted output signal; reference potential; and switch means for selectively connecting a first output of a predetermined inverter means to the reference potential in response to the clock signal connected thereto.

\* \* \* \* \*